(12) United States Patent
Park

(10) Patent No.: US 6,566,207 B2
(45) Date of Patent: May 20, 2003

(54) SEMICONDUCTOR DEVICE FABRICATING METHOD

(75) Inventor: Joo-Han Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/117,882

(22) Filed: Apr. 8, 2002

(65) Prior Publication Data

US 2003/0022460 A1 Jan. 30, 2003

(30) Foreign Application Priority Data

Jul. 30, 2001 (KR) ........................... 2001-45822

(51) Int. Cl.[7] ................ H01L 21/336; H01L 21/76
(52) U.S. Cl. ................. 438/296; 438/297; 438/424; 438/425; 438/439; 438/221; 438/225
(58) Field of Search .................... 438/296, 297, 438/424, 425, 439, 221, 225

(56) References Cited

U.S. PATENT DOCUMENTS

| | | | | |
|---|---|---|---|---|
| 6,017,800 A | * | 1/2000 | Sayama et al. | |
| 6,124,184 A | * | 9/2000 | Jeong | |
| 6,333,232 B1 | * | 12/2001 | Kunikiyo | |
| 6,380,020 B1 | * | 4/2002 | Shimizu | |
| 6,404,024 B1 | * | 6/2002 | Ishigaki | |

* cited by examiner

Primary Examiner—John F. Niebling
Assistant Examiner—Stanetta Isaac
(74) Attorney, Agent, or Firm—Mills & Onello, LLP

(57) ABSTRACT

A method of fabricating a semiconductor device in which a LOCOS profile characteristic is applied to a normal shallow trench isolation (STI) structure thereby lowering compressive stress that is concentrated on the side of the STI and preventing a thinning phenomenon by which the oxide film is formed in a relatively thin thickness at the boundary of the STI and the gate oxide film for high voltage (HV) region. The STI of a CVD oxide material including an angular bird's beak extension structure is formed in a field region, a gate oxide film is formed in a relatively thick thickness in a HV region by using a nitride film as a mask, and a gate oxide film having a relatively thin thickness is formed in a low voltage (LV) region.

12 Claims, 13 Drawing Sheets

SEMICONDUCTOR DEVICE FABRICATING METHOD

FIELD OF THE INVENTION

The present invention relates to a method of fabricating a semiconductor device by which a thickness of an oxide film is prevented from being relatively thinned at the boundary between a shallow trench isolation structure and a thick gate oxide film when a dual gate oxide fabrication process is applied to a normal shallow trench isolation structure.

DESCRIPTION OF THE RELATED ART

Power devices such as a liquid crystal display (LCD) driver integrated circuits IC (LDI) require both low voltage (LV) operation for driving an associated logic circuit together with high voltage (HV) operation for driving the LCD during operation. Accordingly, associated gate oxide films are commonly formed of the dual-gate type. In addition, the continuous trend toward ever-miniaturized line width requires the use of a shallow trench isolation (STI) process for isolating adjacent circuit components.

However, if the process for fabricating the dual gate oxide film is conducted in the same manner as it is applied to the normal STI structure, excessive numbers of STI recesses in the LV region are created during formation of the dual gate oxide film for the HV region, resulting in compromise of the overall device characteristics.

The reason for this is that since the STI is formed of a CVD oxide film material such as USG or HDP, while, in contrast, a gate oxide film is formed of a thermal oxide film material, a severe dent is created in the boundary between an active region and a field region due to the difference in wet etch rate between the thermal oxide film and CVD oxide film, when the dual gate oxide film is formed by an etching process.

Such a conventional process is explained in greater detail explained with reference to FIGS. 1A through 1C below, which illustrate processes for fabricating a conventional dual gate oxide film.

For the sake of convenience, the processes are explained as being divided into 3 steps as follows. In the drawings, reference symbol "I" indicates a first active region in which a thin gate oxide film for LV is formed and reference "II" indicates a second active region in which a thick gate oxide film for HV is formed.

First Step:

As shown in FIG. 1A, a nitride film pattern (not shown) is formed in the first and second active regions I, II of the substrate 10. The silicone substrate 10 is selectively etched to a predetermined thickness by using the pattern as mask so that trench (t) is formed in the field region within the substrate 10. The CVD oxide film of USG or HDP material is formed on the resultant material so that the trench (t) is sufficiently filled. Next, the CVD oxide film is chemically mechanically polished so that the nitride pattern in the first and second active regions I, II may remain and thereafter the nitride film is removed. In this manner, the STI 12 that buries the inside of the trench (t) is formed. Subsequently, CMOS well ion-implantation and channel ion-implantation are performed. The first thermal oxide film 14 for HV is subsequently formed in a thickness of 300 Å in the active region I, II on the substrate 10.

Second Step:

As shown in FIG. 1B, a photo-resist pattern 16 is formed on the resultant structure so that the first active region I and the surrounding STI 12 may partly be opened. The first thermal oxide film 14 is wet etched using the pattern as a mask and selectively remains only in the HV region II.

Third Step:

As shown in FIG. 1C, the photo-resist pattern 16 is removed and the second thermal oxide film 18 for LV is formed at a thickness of 40 Å in the first active region I. Thereby, the process for the dual gate oxide film is completed. In this case, when the second thermal oxide film 18 is formed, the first thermal oxide film 14 also grows. However, since the amount of the growth is minor, the resultant effect may be negligible.

As a result, the first active region I is formed therein with a thin gate oxide film of the second thermal oxide film 18 material, which is for LV operation. Also, the second active region II is formed therein with a thick gate oxide film of the first thermal oxide film 14 material, which is for HV operation.

However, if the dual gate oxide film is formed according to the aforementioned process, there is a problem as follows during the formation of device.

When the first thermal oxide film 14 of LV region I is removed by using the photo-resist pattern 16 as a mask, the STI 12, which is indicated by ⓐ in FIG. 1B, surrounding the circumference of LV region is recessed together with the first thermal oxide film 14. Accordingly, a dent is generated in the region, that is, in the boundary surface between the active region and the field region. FIG. 2 shows the structure of a device having such defect.

Such a defect phenomenon is caused by the difference in a wet etch rate between the first thermal oxide film 14 being used as a gate oxide film and the CVD oxide film forming the STI 12. For example, in the case that the STI 12 is filled with a HDP material, the depth of the recess is approximately 200 Å relative to the substrate 10 of the active region. In contrast, in the case that the STI 12 is filled with a USG material, the recess amounts to approximately 1,000 Å relative to the substrate 10 of the active region, creating a more severe dent in this case.

In the event that the dent is created, poly residue remains in the region that is recessed during etching of the gate poly as a follow up process, or the gate poly surrounds the field region and the active region at the boundary between the field region and the active region. This results in deterioration in the gate oxide film due to the concentration of electric field created in an upward and sideward direction, as well as deterioration in characteristics such as drop in threshold voltage Vth of the resulting transistor during the operation of device, increase in threshold voltage leakage, and decrease in punching margin.

In order to solve those problems, there has been disclosed a process technique by which a dual gate oxide film is formed by using a nitride film as a mask even without the need for removing the thick thermal oxide film in the LV region, while the process of fabricating the dual gate oxide film is applied to a normal STI structure in LDI design.

FIGS. 3A through 3E show in order a method of forming such a dual gate oxide. The method comprises the following five steps. Reference symbol "I" indicates a LV region in which a thin gate oxide film is formed, and reference symbol "II" indicates a HV region in which a thick gate oxide film is formed.

First Step:

As shown in FIG. 3A, the STI 102 of the CVD oxide film material that buries the inside of the trench (t) is formed in the field region on the silicone substrate 100 according to the same method as that shown above in FIG. 1A. The buffer oxide film 104 of the thermal oxide film material is subsequently formed in the active regions I, II on the substrate 100 and CMOS well ion-implantation and channel ion-implantation are performed. While the buffer oxide film 104 remains intact, a nitride film 106 is formed on the buffer oxide film 104 including the STI 102. Thereafter, the CVD oxide film 108 of medium temperature oxide (MTO) is formed on the resultant material. Here, the MTO refers to an oxide film that is formed at the temperature of 700 to 800° C. The buffer oxide film 104 is formed in a thickness of 100 to 120 Å, the nitride film 106 is formed in a thickness of 90 to 110 Å and the CVD oxide film 108 is formed in a thickness of 90 to 110 Å.

Second Step:

As shown in FIG. 3B, the CVD oxide film 108 is patterned by a photo-resist pattern 110 so that the first active region I and the surrounding STI 102 may partly be masked. The second active region II and the adjacent CVD oxide film 108 are wet etched using the pattern 110 as a mask.

During the third step shown in FIG. 3C, the photo-resist pattern 110 is removed.

During the fourth step shown in FIG. 3D, the nitride film 106 and the buffer oxide film 104 are in order etched by utilizing a mask of the residual CVD oxide film 108, thereby exposing the surface of the second active region II. At this time, the nitride film 104 is etched by a wet etching method in which phosphoric acid is used as etchant.

The residual CVD oxide film 108 that was used as a mask is simultaneously removed when the buffer oxide film 104 is etched. The first thermal oxide film 112 is then formed at a thickness of 400 to 450 Å on the exposed surface of the second active region II.

In the fifth step shown in FIG. 3E, the nitride film 106 and the buffer oxide film 104 that remain in the first active region I and the adjacent STI 102 are in order etched, thereby exposing the surface of the first active region I. In this case, since a part of the first oxide film 112 is also consumed during the etching process (particularly, etching of the buffer oxide film), the first thermal oxide film 112 remains only at a thickness of approximately 250 to 350 Å on the second active region II when the etching process on the residual films are completed. The second thermal oxide film 114 is formed in a thickness of 30 to 50 Å on the exposed surface of the first active region I, such that the second thermal oxide film 114 is thinner than the first thermal film 112. Thereby, the processes for forming the dual gate oxide film are completed. Here, when the second thermal oxide film 114 is formed, the first thermal oxide film 112 of the second active region II also grows an additional amount. However, since the amount of the growth is minor, the resultant effect is negligible.

As a result, the first active region I is formed therein with a thin gate oxide film of the second thermal film 114 material appropriate for LV, and the second active region II is formed therein with a thick gate oxide film of the first thermal film 112 material appropriate for HV.

In the case that the dual gate oxide film is fabricated according to such a method, dent formation can be prevented at the boundary between the active region and field region because the process of removing the thick thermal oxide film in the LV region is not needed during the formation of the thick gate oxide film in the HV region.

However, during growth of the thick gate oxide film of the first thermal oxide film 112 in the second active region II by using the nitride film 106 as a mask, there is a problem in that the first thermal oxide film 112 experiences relatively less growth at the boundary (indicated by ⓑ in FIG. 3E) between the STI 102 and the active region, as compared to adjacent portions. As a result, the first thermal oxide film 112 is severely thinned at the edge portion of the STI 102. The thicker the gate oxide film, the more rapidly this phenomenon is accelerated. FIG. 4 shows the structure of a device having such a defect. In the drawing, the symbol "l" indicates the predetermined thickness of the first thermal oxide film 112 and "l–α" indicates the resulting thickness of the first oxide film 112 in the boundary region as a result of the thinning phenomenon.

The source of the thinning phenomenon is the compressive stress that is concentrated at the sides of the STI 102 that is relatively stiff during the thermal oxidation process. When such thinning phenomenon occurs, the gate oxide film is deteriorated due to the concentration of electric field, in addition, an effective transistor is formed at the center of the active region with channels (the channel of flat TR) and turned-on just after a transistor is first formed at the boundary of the active region and field region with channels (the channel of corner TR) and turned-on. As a result of this effective transistor, a hump phenomenon occurs, by which it appears as if the resulting transistor has two Vth values, which should be avoided.

SUMMARY OF THE INVENTION

Accordingly, it is an object of the present invention to provide a semiconductor device fabricating method by which a local oxidation of silicon (LOCOS) process is applied to a normal STI structure so that a trench is formed through a LOCOS oxide film and in which the STI includes a portion of a structure, referred to as a "bird's beak" structure, of the LOCOS oxide film so that a side portion of the resulting STI structure includes a slanted structure, and, at the same time, the silicon substrate has a crystal structure (1, 1, 1) at an edge part of an active region that contacts the STI. As a result, thinning of the gate oxide film at an edge portion of STI is mitigated and/or eliminated by relative easing of the compressive stress that would otherwise be concentrated at a side portion of STI during growth of the gate oxide film for HV.

In order to achieve the above object, according to one aspect of the present invention, the semiconductor device fabricating method according to the present invention comprises the steps of: forming a deposition structure of pad oxide film/nitride film/oxide film on a semiconductor substrate so that a field region is exposed; performing an oxidation process using the resultant structure as a mask so that a LOCOS oxide film including a lateral extension, for example an angular bird's beak extension, is formed in the field region; etching the silicon substrate and the LOCOS oxide film to a predetermined thickness using the resultant structure as a mask so that a trench is formed in the field region; forming a CVD oxide film on the resultant structure so that the trench is sufficiently filled; forming a STI of oxide film material including the lateral extension in the field region by processing the CVD oxide film by a CMP process so that the nitride film remains in a predetermined thickness on the pad oxide film; removing the remained nitride film and the pad oxide film so that the first and second active regions are exposed; performing a CMOS-well ion-implantation process and a channel ion implantation process; performing a nitride film deposition process and a following etching process so that a nitride film remaining in the first active region and the second active region is exposed; forming a first thermal oxide film for a gate oxide film in the second active region by using the remaining nitride film as a mask; removing the remaining nitride film in the first active region; and forming in the first active region a second thermal oxide film for a gate oxide film that is thinner in thickness than the first oxide film.

According to another aspect of the present invention, the semiconductor device fabricating method according to the present invention, comprises the steps of: forming a deposition structure of pad oxide film/nitride film/oxide film on a semiconductor substrate so that a field region is exposed; performing an oxidation process using the resultant structure as a mask so that a LOCOS oxide film including a lateral extensions, for example an angular bird's beak-shaped extension, is formed at the field region; etching the silicon substrate and the LOCOS oxide film to a predetermined thickness using the resultant structure as a mask so that a trench is formed at the field region; forming a CVD oxide film on the resultant structure so that the trench is sufficiently filled; forming a STI of oxide film material including the lateral extension in the field region by processing the CVD oxide film by a CMP process so that the nitride film remains in a predetermined thickness on the pad oxide film; removing the remaining nitride film and the pad oxide film so that the first and second active regions are exposed; performing a CMOS-well ion-implantation process and a channel ion implantation process; forming a first thermal oxide film for a gate oxide film in the first active region and the second active region; removing the first thermal oxide film in the first active region; and forming, in the first active region, a second thermal oxide film for a gate oxide film thinner than the first thermal oxide film.

The first active region preferably indicates a low voltage (LV) region and the second active region indicates a high voltage (HV) region.

According to the processes of the present invention, since the side portions of the STI structure is formed with a slanted angular extension (for instance, a bird's beak shape), and not a conventional vertical shape, and since an etching process is performed so that a portion of the bird's beak is also etched when the remaining nitride film and the pad oxide film in the first and second active regions are removed, the silicon substrate has the crystal structure (1, 1, 1) at the edge portions of the first and second active regions that are in contact with the STI.

As a result, compressive stress that otherwise would be concentrated at the side portion of the STI during the oxidation process can be eased relative to the conventional technique, thereby preventing the thickness of the gate oxide film for HV from being relatively thinned at the edge portion of STI.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Figure 1A:
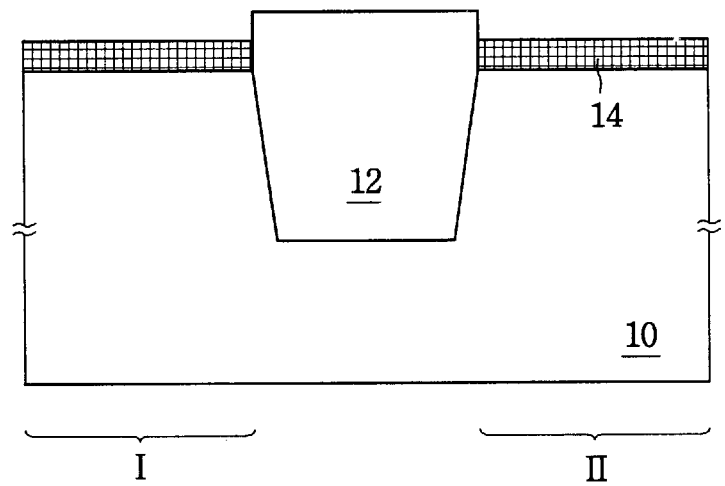
FIGS. 1A to 1C are process views showing methods of fabricating a dual gate oxide film according to a conventional process.
Figure 1B:
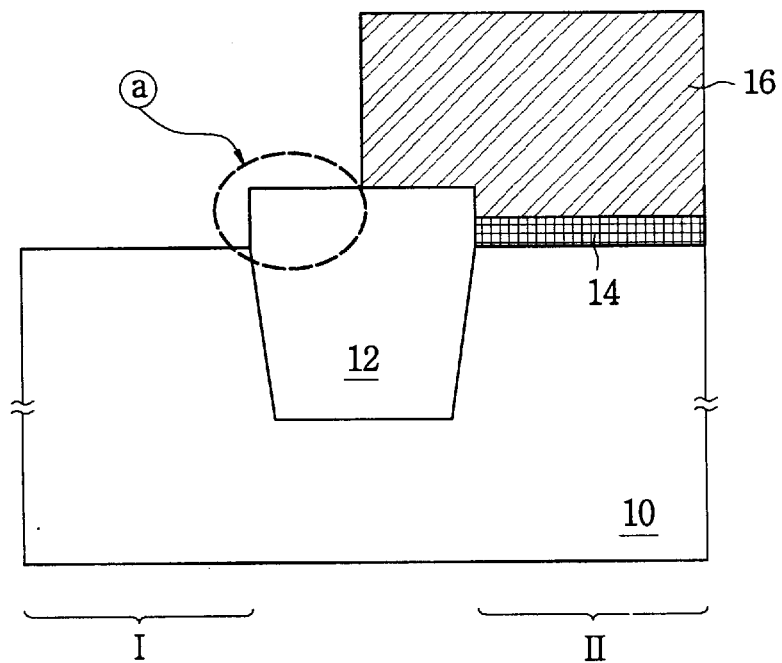
Figure 1C:
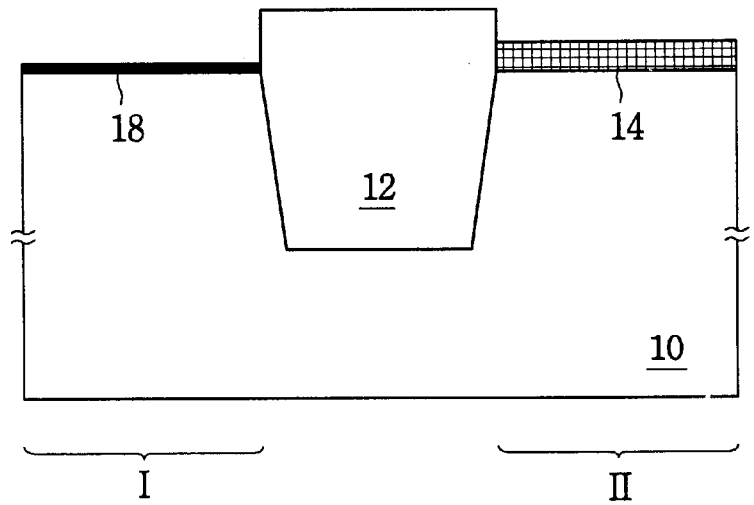
Figure 2:
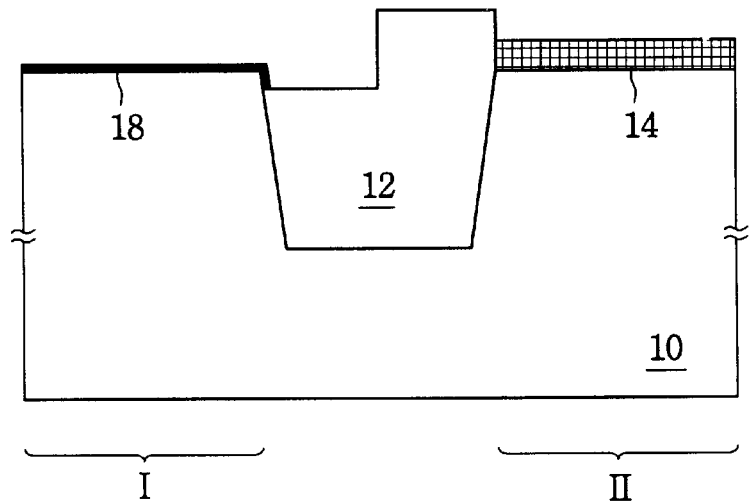
FIG. 2 is a cross sectional view showing a defect pattern that is generated when the dual gate oxide film is formed according the process shown in FIGS. 1A to 1C.
Figure 3A:
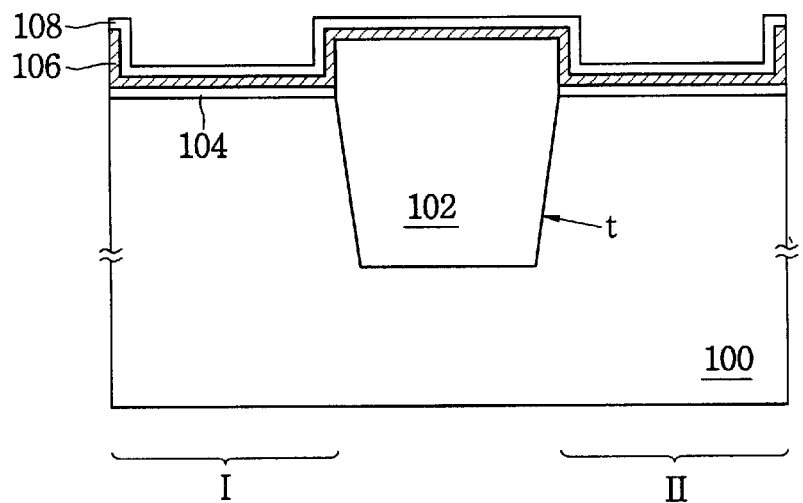
FIGS. 3A to 3E are process views showing a method of fabricating a dual gate oxide film according to another conventional method.
Figure 3B:
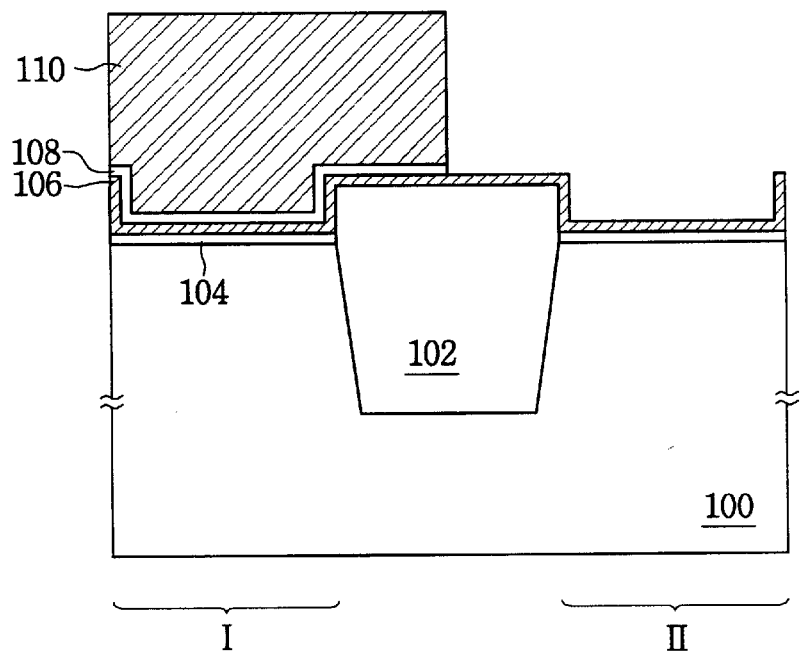
Figure 3C:
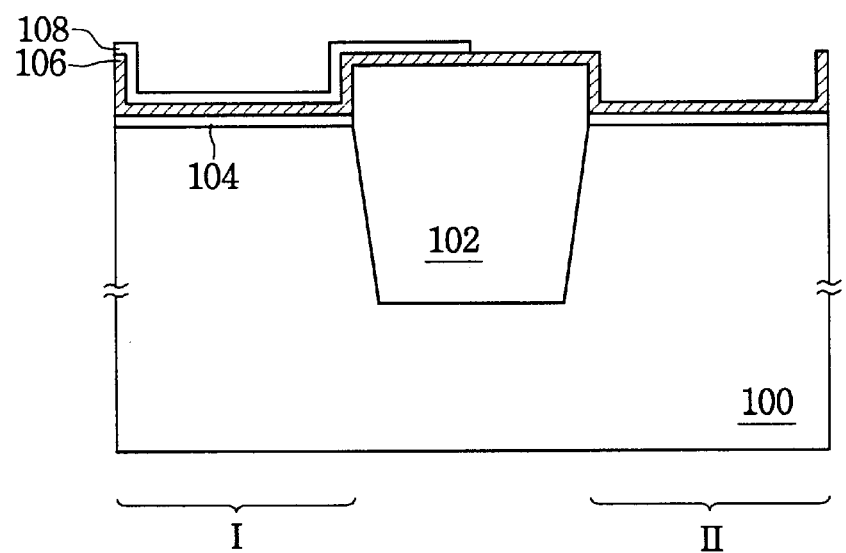
Figure 3D:
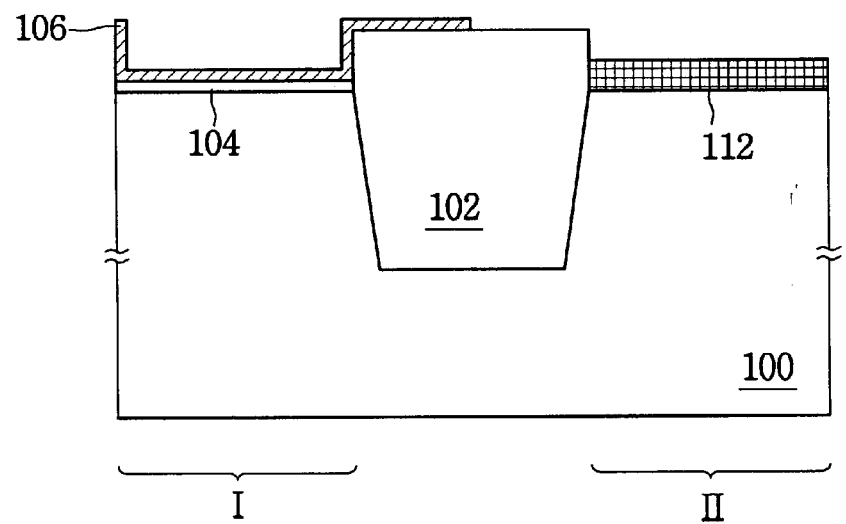
Figure 3E:
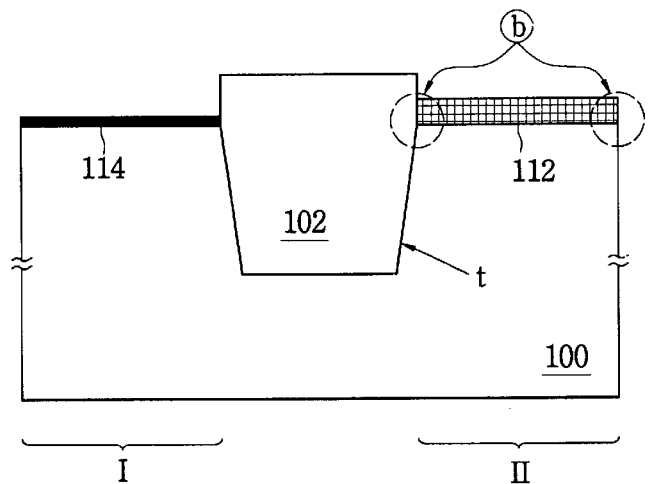
Figure 4:
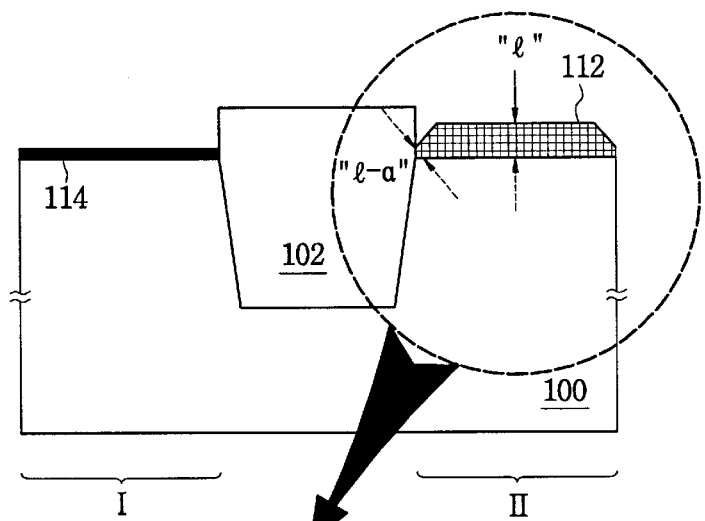
FIG. 4 is a cross sectional view showing a defect pattern that is generated when the dual gate oxide film is formed according the process shown in FIGS. 3A to 3E.
Figure 4:
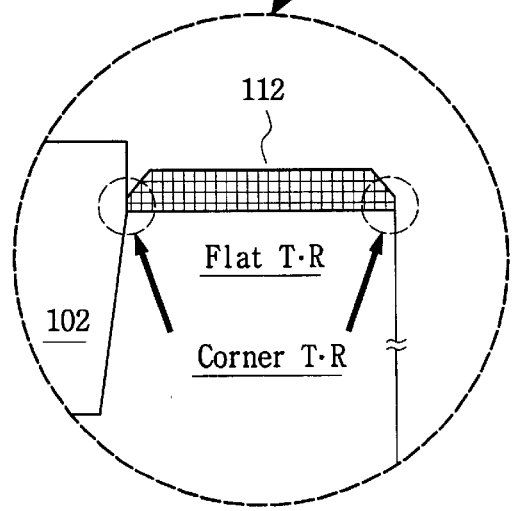

Hereinafter, preferred embodiments will be explained in detail with reference to the accompanying drawings.

Referring to FIGS. 5A to 5H that in order show a process for fabricating a dual gate oxide film according to the present invention, the process is explained by the following eight steps. In the drawings, reference symbol "I" indicates the first active region that is to be used as a LV region (in which a thin gate oxide film is formed). Reference symbol "II" indicates the second active region that is to be used as a HV region (in which a thick gate oxide film is formed). The HV region is a region in which an operational voltage is in the range of 3.3 to 50 V.

Figure 5A:
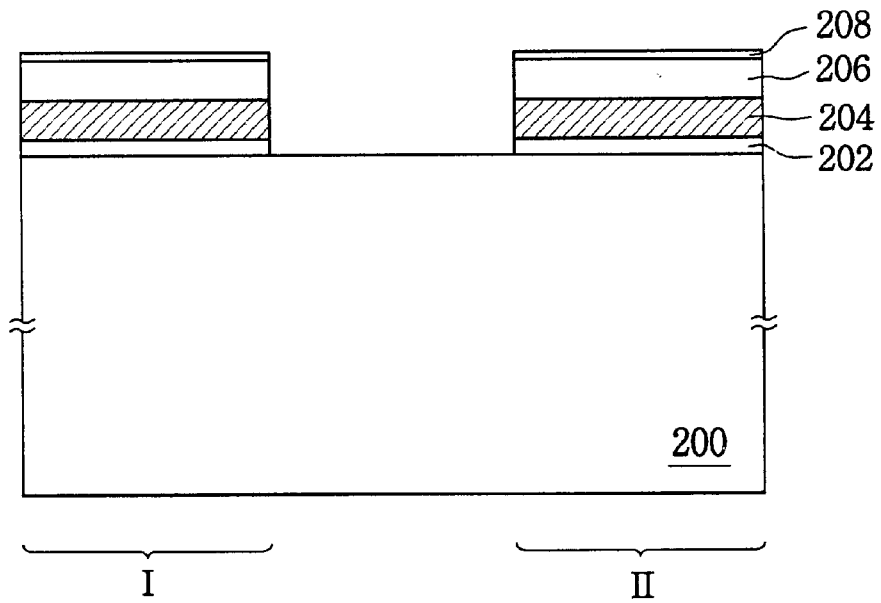
FIGS. 5A to 5H are process views showing a method of fabricating a dual gate oxide film according to an embodiment of the present invention.

First Step:

As shown in FIG. 5A, a pad oxide film 202, nitride film 204, and an oxide film 206 of HTO material are deposited in order. Thereafter the oxide film 206 is coated with an antireflective layer (ARL) 208 in order to prevent diffused reflection during a subsequent etching process and in order to thereby form accurate patterns. Next, the ARL 208, oxide film 206, nitride film 204 and pad oxide film 202 are in order etched by using a photo-resist pattern (not shown) as a mask, thereby a portion of the substrate 200 to be used as a field region is exposed. As a result, a deposition structure such as "pad oxide film 202/nitride film 204/oxide film 206 coated with ARL 208" is selectively formed at the first and second active regions I, II only. The nitride film 204 operates as an anti-oxidation film during a subsequent LOCOS process, and the ARL coating process may be skipped, depending on the application.

Figure 5B:
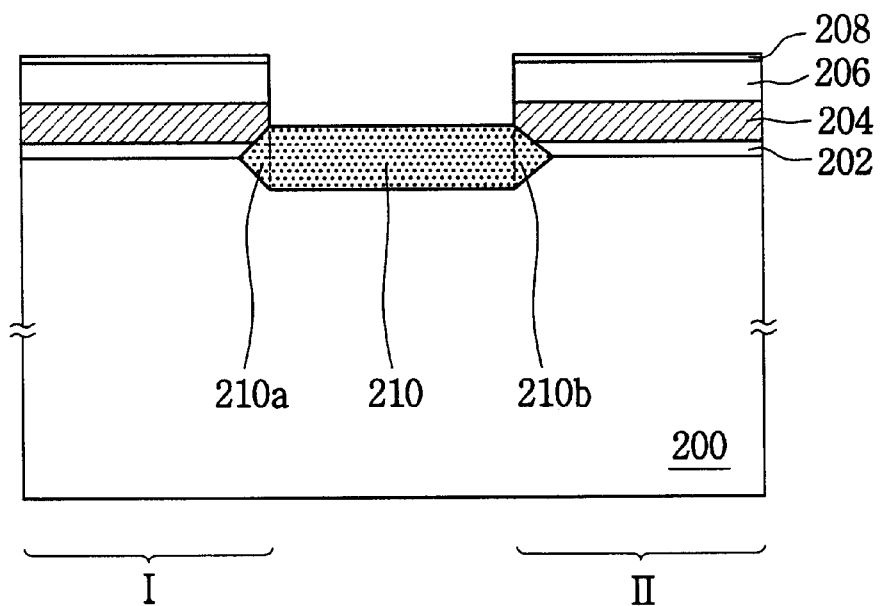

Second Step:

As shown in FIG. 5B, a LOCOS oxide film 210 including angled "bird's beak" extensions 210a, 210b, is formed at the field region by performing an oxidation process using the resultant structure of "pad oxide film 202/nitride film 204/ oxide film 206 coated with ARL 208" as a mask.

Figure 5C:
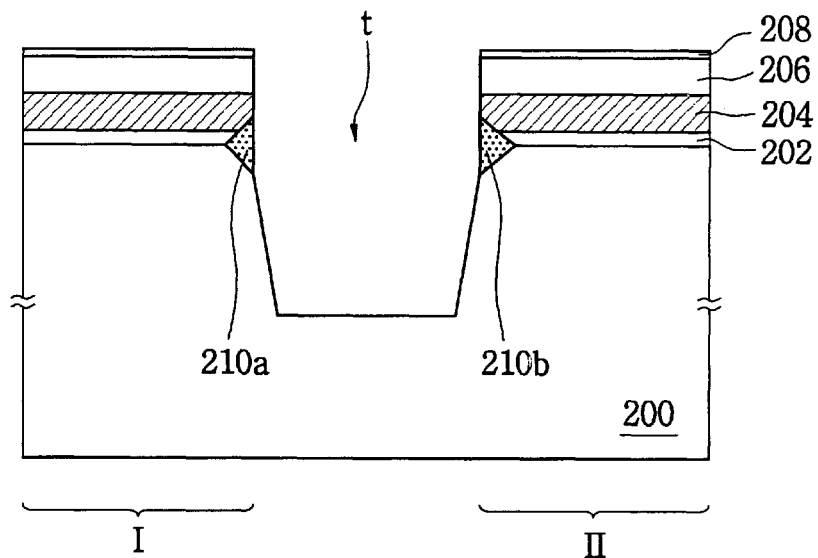

Third Step:

As shown in FIG. 5C, the silicone substrate 200 and the LOCOS oxide film 210 are selectively etched to a predetermined thickness by using the above resultant pattern as a mask so that trench (t) is formed in the field region within the substrate 200.

Figure 5D:
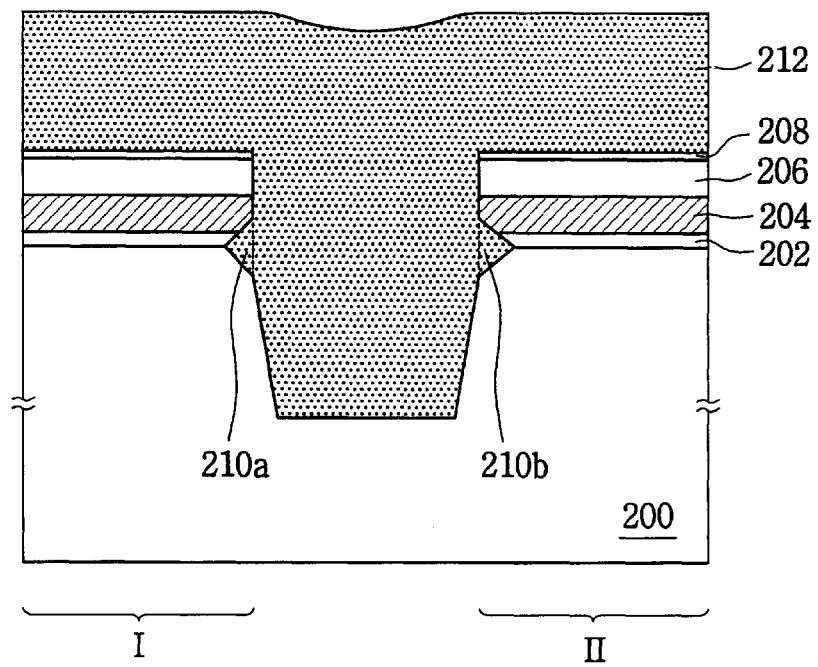

Fourth Step:

As shown in FIG. 5D, the CVD oxide film 212 of USG or HDP material is deposited on the above resultant structure so that the trench (t) is sufficiently filled.

Figure 5E:
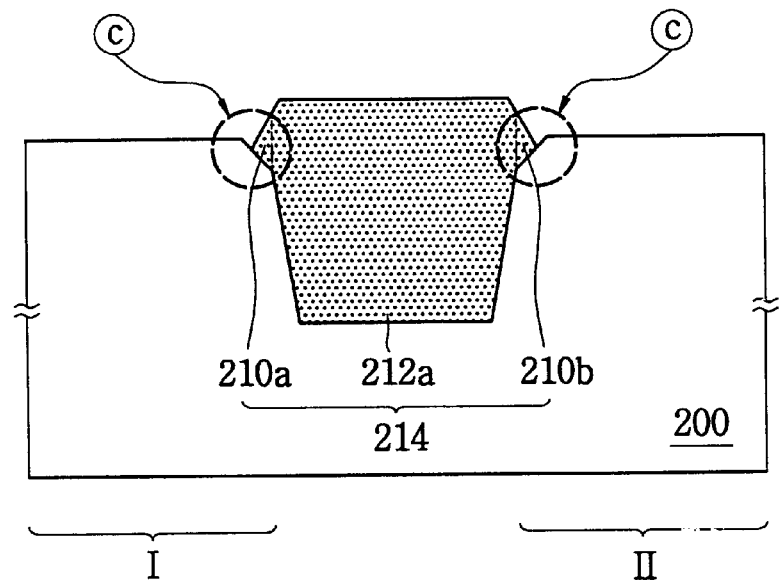

Fifth Step:

As shown in FIG. 5E, the CVD oxide film 212 is chemically mechanically polished so that the nitride pattern film 204 may partly remain in a predetermined thickness (for instance, ½ to ⅓ of the original deposition thickness) on the pad oxide film 202, and the STI 214 of the CVD oxide film 212a material including the bird's beak 210a, 210b.

Thereafter, the residual nitride film 204 and the pad oxide film 202 are removed, thereby the first and second active regions I, II are exposed. Next, a CMOS well ion-implantation process and a channel ion implantation process are performed.

Since portions of the bird's beak structures 210a, 210b that form the STI 214 are also partly recessed when the remaining nitride film 201 and the pad oxide film 202 at the first and second active regions I, II are removed, a crystal surface (1, 1, 1) of the silicon substrate is exposed at the edge portions C of the first and second active regions I, II that contact the STI 214, as a result of the etching process.

As described above, since the side portion of the STI 214 is formed in a bird's beak shape, having an angular slant geometry, as described above, the compressive stress that is concentrated at the side portion of the STI 214 during a subsequent oxidation process can be relatively eased, thereby preventing the above-described edge thinning phenomenon in the HV gate oxide film. In addition, since the silicon substrate has the crystal structure (1, 1, 1) at the portion where the STI 214 and the first and second active regions I, II contact each other, and since the portion having the crystal structure (1, 1, 1) grows more rapidly than would a portion having a crystal structure of (1, 0, 0), an oxide film of the portion having the crystal structure (1, 1, 1) can be formed to a relatively larger thickness than the portion having another crystal structure (for instance, (1, 0, 0)), thereby preventing the thinning phenomenon in the HV gate oxide film. In this description, the crystal plane (1, 0, 0) indicates the silicon crystal structure when a silicon substrate is viewed from above, and the crystal plane (1, 1, 1) indicates a crystal structure in an angular portion that is exposed by recesses of the bird's beak extensions 210a, 210b.

Figure 5F:
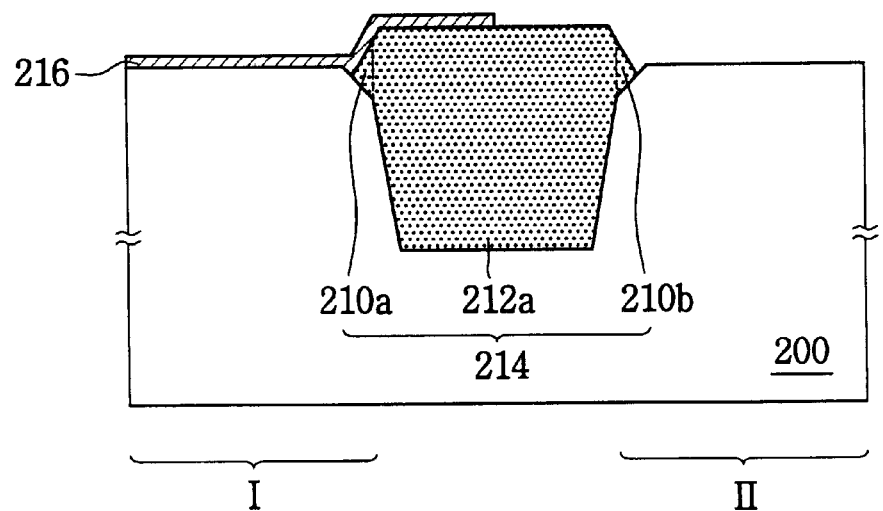

Sixth Step:

As shown in FIG. 5F, a nitride film 216 is deposited on the first and second active regions I, II including the STI 214. Thereafter, the nitride film 216 is selectively etched so that the second active region II and the adjacent STI 214 are exposed. As a result, the nitride film 216 remains in the first active region I.

Figure 5G:
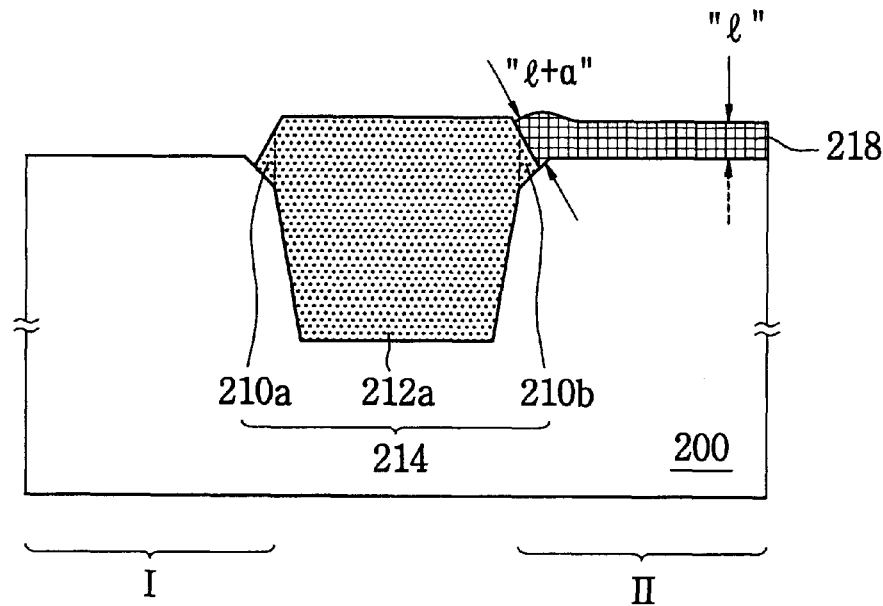

Seventh Step:

As shown in FIG. 5G, the first thermal oxide film 218 is formed to a thickness of 400 to 450 Å in the second active region II by using the remaining nitride film 216 as a mask. Since silicon having the crystal structure (1, 1, 1) is exposed at the edge portion C (see FIG. 5E, above) of the second region that is in contact with the angular bird's beak extension 210b of the STI 214, as described above, the first thermal oxide film 218 is formed in this region to a slightly thicker depth as compared to the portions having the crystal structure (1, 0, 0). In FIG. 5G, the reference symbol "l" indicates a desired thickness of the thermal oxide film 218 that is originally predetermined, while "l+α" indicates a thickness of the first thermal oxide film 218 that is thicker than the other portions due to its rapid rate of growth. Subsequently, the remaining nitride film 216 in the first active region is removed to thereby expose the first active region I.

Figure 5H:
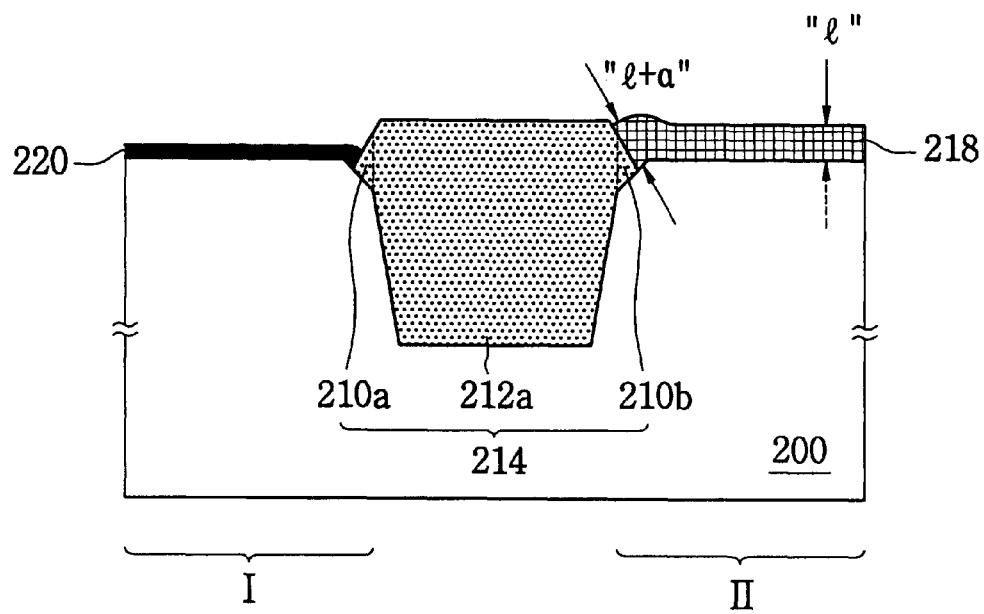

Eighth Step:

As shown in FIG. 5H, a second thermal oxide film 220 having a thickness of 30 to 50 Å, and being formed at a thickness that is less that of the first thermal oxide film 218, is formed in the first active region I. The process for forming the dual gate oxide film is thereby completed. In this process, when the second thermal oxide film 220 is formed, the first thermal oxide film 218 also grows to a small degree. However, since the amount of the growth is minor, the resultant effect is negligible.

As a result, the first active region I is formed therein with a relatively thin gate oxide film of the second thermal film 220 material, which is suitable for an LV region. The second active region II is formed therein with a relatively thick gate oxide film of the first thermal film 218 material, which is suitable for an HV region.

In the process of fabricating the dual gate oxide film as described above, since a device is designed so that the STI 214 includes a portion of the bird's beak extensions 210a, 210b of the LOCOS oxide film 210, the side portion of the STI 214 has an slanted angular structure (for instance, a bird's beak-shaped pattern), and not a conventional vertical pattern. In addition, since a portion of the bird's beak extensions 210a, 210b is also recessed when the pad oxide film 201 and the nitride film 201 remaining in the first and second active regions I, II are removed, the silicone substrate has the crystal structure (1, 1, 1) at the edge portions of the first and second active regions I, II that are in contact with the STI 214.

In this case, the compressive stress that is concentrated at the side of the STI 214 during an oxidation process can be eased, as compared to the conventional approach, and the gate oxide HV film is formed at a relatively thicker thickness at the edge portions of the first and second active regions I, II, as compared to the other portions having the crystal structure (1, 0, 0).

Accordingly, the process technique as described above serves to prevent the gate oxide film from thinning at the interface of the second active region II and the STI 214. In addition, the hump phenomenon and the electric field concentration, which otherwise can occur during device operation, can be prevented, thereby improving operation characteristics of the resulting transistor.

In another embodiment of the present invention, the process for the dual gate oxide film may be performed by applying a common photo process instead of the nitride film masking approach. This embodiment is explained below according to the following eight steps. Referring to FIGS. 6A to 6H showing process views for illustrating a dual gate oxide film forming method, reference symbol "I" indicates a first active region to be used as a LV region (in which a relatively thin gate oxide film be formed) and reference symbol II indicates a second active region to be used as a HV region (in which a relatively thick gate oxide film is formed). The HV region is a region in which an operational voltage is in the range of 3.3 to 50 V. In this embodiment, since the processes as shown in FIGS. 6A to 6E are preformed in the same manner as in the processes as shown in FIGS. 5A to 5E, these same processes will not be explained again in detail. The subsequent steps are explained as follows.

The first to fifth steps, as shown in FIG. 6A to FIG. 6E, are applied in the same manner as in the process technique described in the first embodiment, which correspond to the process steps as shown in FIG. 5A to FIG. 5E. That is, the STI 214 of the CVD oxide film 212a material including the bird's beak extensions 210a, 210b is formed in the field region on the substrate 200. The pad oxide film 201 and the nitride film 204 remaining in the active region are removed in order, and thereby the first and second active regions I, II on the substrate 200 are exposed. Subsequently, the CMOS well ion implantation process and the channel ion implantation process are performed.

Figure 6A:
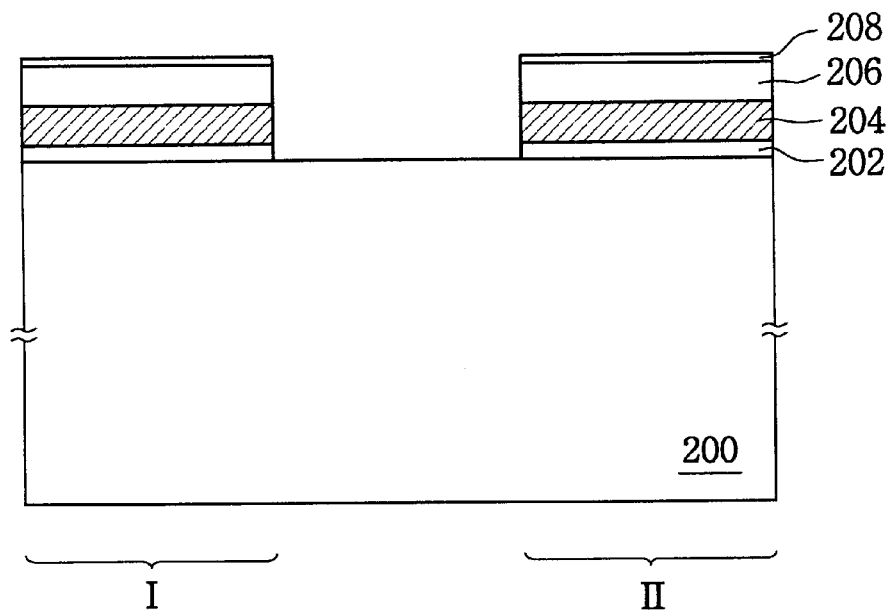
FIGS. 6A to 6H are process views showing a method of fabricating a dual gate oxide film according to another embodiment of the present invention
Figure 6B:
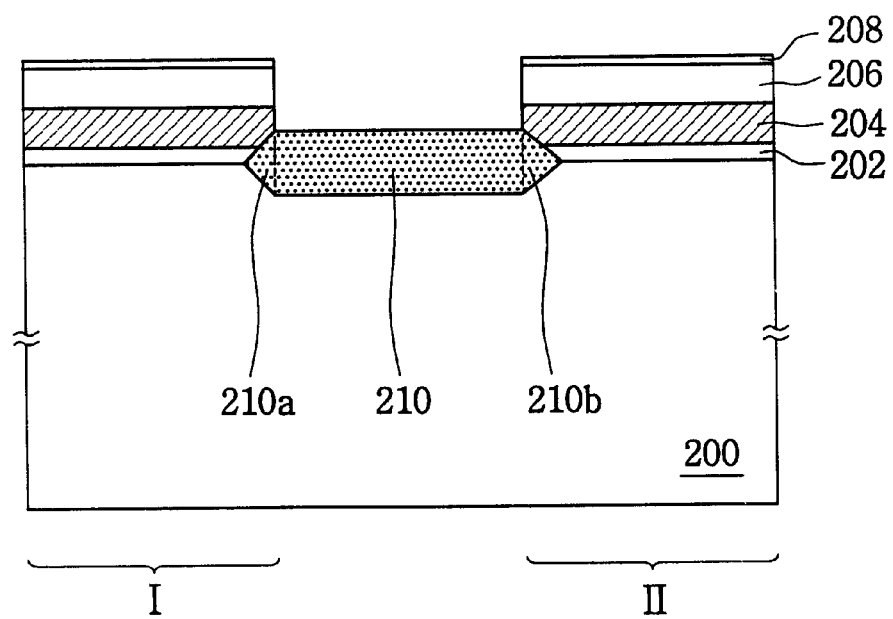
Figure 6C:
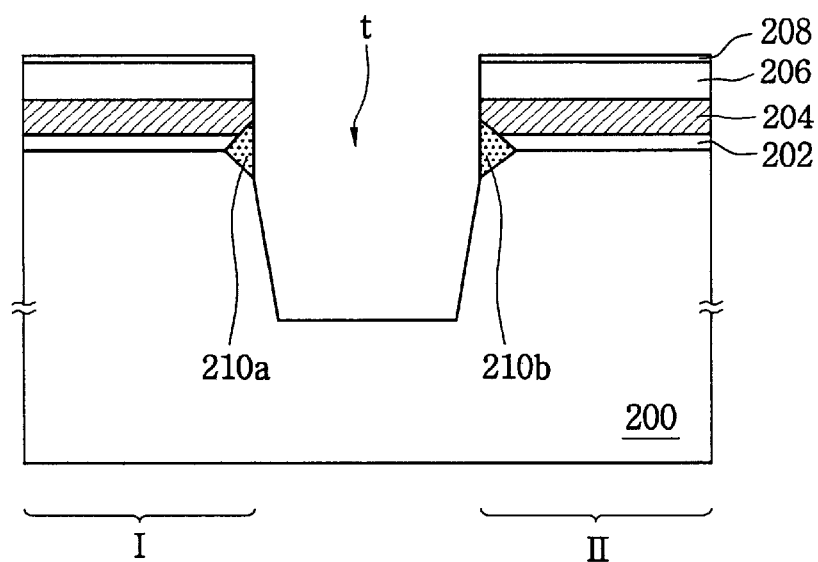
Figure 6D:
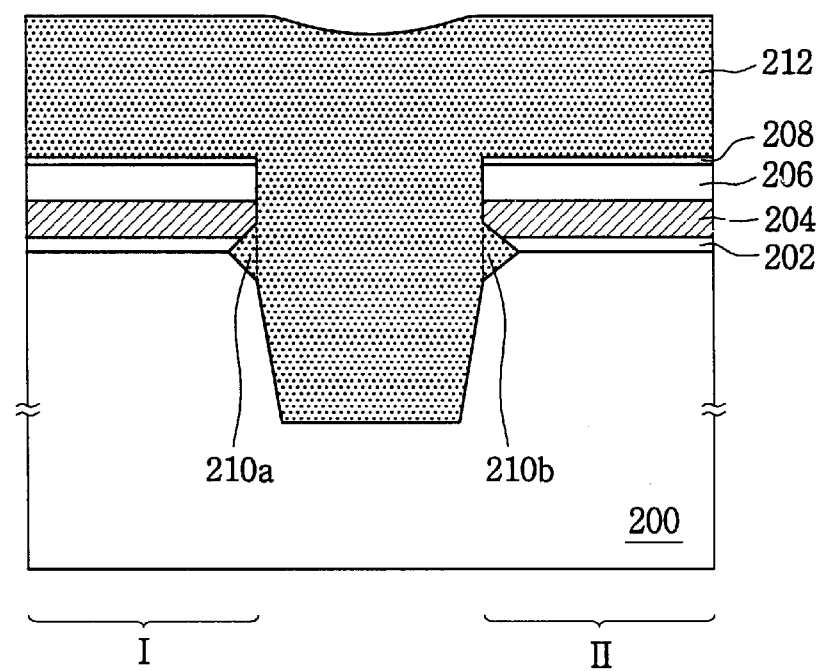
Figure 6E:
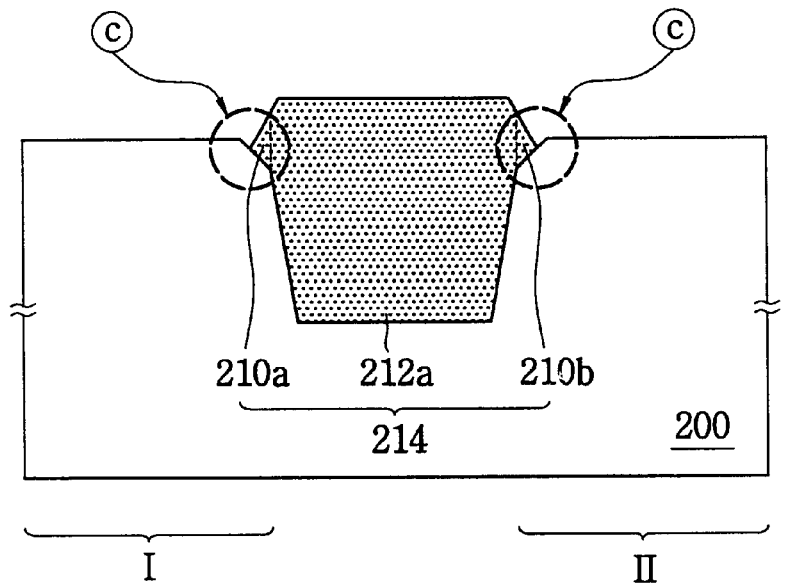
Figure 6F:
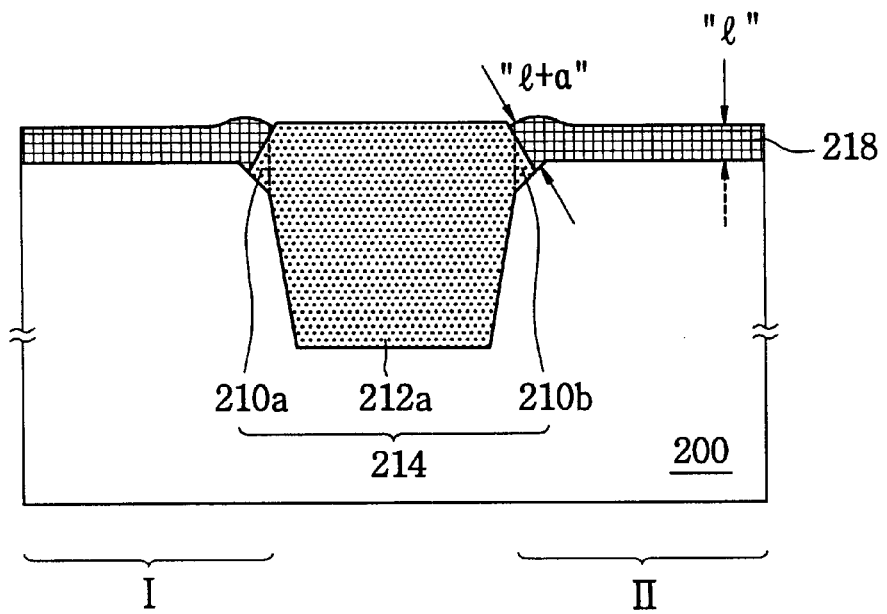

In the sixth step, the first thermal oxide film 218 is formed to a thickness of 400 to 450 Å in the first and second active regions I, II on the substrate 200, as shown in FIG. 6F. In this case, since the regions of the silicone substrate at the edge portions C of the first and second active regions I, II that contact the STI 214 have the crystal structure (1, 1, 1), which results from the recession of the bird's beak extensions 210a, 210b occurring when the nitride film 201 and the pad oxide film 202 are removed, the first thermal oxide film 218 is formed to a thickness that is relatively thicker than the thickness than in the portions having the crystal structure (1, 0, 0). The reference symbol "1" indicates a predetermined thickness of the thermal oxide film 218 that is originally desired and "1+α" indicates a thickness of the first thermal oxide film 218 that has become thicker than the other portions due to its rapid rate of growth.

Figure 6G:
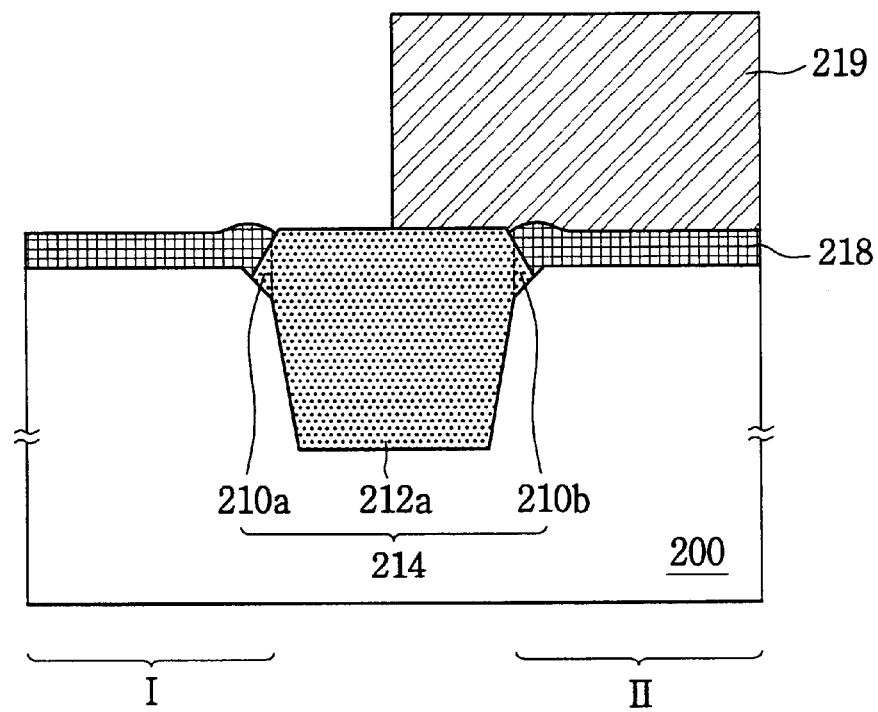

In the seventh step, as shown in FIG. 6G, a photo-resist pattern 219 is formed on the resultant structure so that the first active region and the adjacent STI 214 are exposed. The first thermal oxide film 218 is then selectively etched by using the photo-resist pattern as a mask so that the first thermal oxide film 218 remains only in the second active region II for HV.

Figure 6H:
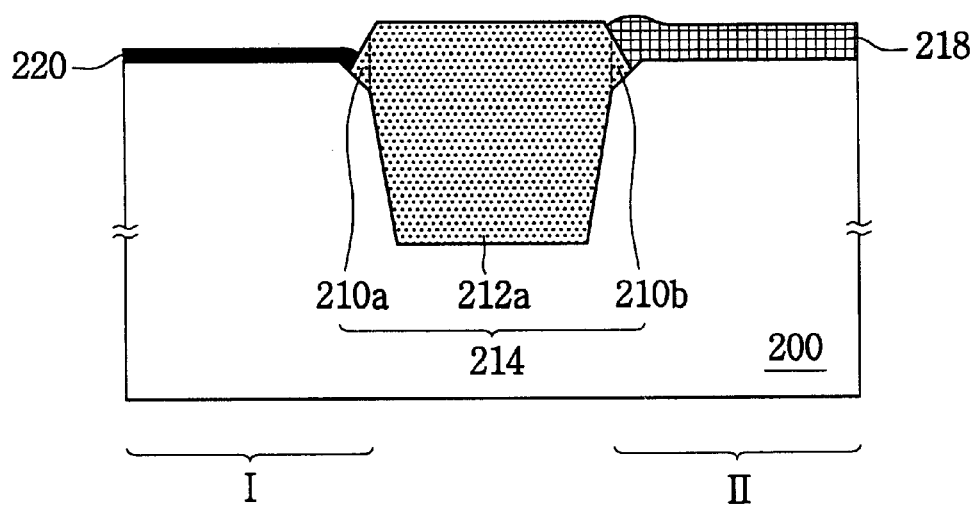

In the eighth step, as shown in FIG. 6H, the photo-resist pattern 219 is removed and the second thermal oxide film 220 having a thickness of 30 to 50 Å, a thickness that is less than the thickness of the first thermal oxide film 218, is formed in the first active region I, thereby the process for the dual gate oxide film is completed. As a result, the first active region I is formed therein with a relatively thin gate oxide film of the second thermal film 220 material, which is suitable for the LV region. The second active region II is formed therein with a relatively thick gate oxide film of the first thermal film 218 material, which is suitable for an HV region.

In the process described above, although a portion of the STI 214 that is adjacent the LV region is recessed together with the first thermal oxide film 218 when the oxide film 218 is removed, the recess amount of the STI can be remarkably reduced, as compared to the case where the CVD oxide film is directly exposed, as in the conventional approach, since the bird's beak extensions 210a, 210b forming the STI 214 are made of a thermal oxide film material. In addition, the silicone substrate has the crystal structure (1, 1, 1) at the edge portions of the first and second active regions and thus, the second thermal oxide film 220 is accordingly formed to a relatively thick thickness, leading to superior device characteristics.

Accordingly, in a dual gate oxide film formed under the processes according to the preferred embodiment, compressive stress that is concentrated on the sides of the STI 214 during the oxidation process can be lowered, as compared to the conventional process. In addition, the thinning phenomenon of the gate oxide film at the edge portions of the second active region II, which otherwise would occur during the formation of the gate oxide film for the HV region, can be prevented.

While this invention has been particularly shown and described with reference to preferred embodiments thereof, it will be understood by those skilled in the art that various changes in form and details may be made herein without departing from the sprit and scope of the invention as defined by the appended claims.

What is claimed is:

1. A semiconductor device fabricating method, comprising the steps of:
   forming a deposition structure of pad oxide film/first nitride film/oxide film in first and second active regions on a semiconductor substrate so that a field region is exposed between the first and second active regions;
   performing an oxidation process using the resultant structure as a mask so that a LOCOS oxide film including a lateral extension is formed in the field region;
   etching the silicon substrate and the LOCOS oxide film to a predetermined thickness using the resultant structure as a mask so that a trench is formed in the field region;
   forming a CVD oxide film on the resultant structure so that the trench is sufficiently filled;
   forming a STI of oxide film material including the lateral extension in the field region by processing the CVD oxide film by a CMP process so that the first nitride film remains in a predetermined thickness on the pad oxide film;
   removing the remaining first nitride film and the pad oxide film so that the first and second active regions are exposed;
   performing a CMOS-well ion-implantation process and a channel ion implantation process;
   performing a nitride film deposition process and an etching process so that a second nitride film remains in the first active region and so that the second active region is exposed;
   forming a first thermal oxide film for a gate oxide film in the second active region by using the remaining second nitride film as a mask;
   removing the remaining second nitride film in the first active region; and
   forming in the first active region a second thermal oxide film for a gate oxide film that is thinner in thickness than the first oxide film.

2. The method as claimed in claim 1, wherein the lateral extension comprises an angular extension.

3. The method of claim 2 wherein the angular extension comprises a bird's beak-shaped structure.

4. The method as claimed in claim 1, wherein the CVD oxide film is formed of USG or HDP material.

5. The method as claimed in claim 1, wherein the LOCOS oxide film is formed of a thermal oxide film material.

6. The method as claimed in claim 1, wherein the first active region is an LV region and the second active region is an HV region.

7. The method as claimed in claim 6, wherein the HV region is designed to operate at an internal voltage of 3.3 to 50 V.

8. The method as claimed in claim 1, further comprising the step of forming an anti reflective layer (ARL) on the oxide film forming the resultant structure.

9. A semiconductor device fabricating method, comprising the steps of:
   forming a deposition structure of pad oxide film/nitride film/oxide film in first and second active regions on a semiconductor substrate so that a field region is exposed between the first and second active regions;
   performing an oxidation process using the resultant structure as a mask so that a LOCOS oxide film including a lateral extension is formed in the field region;
   etching the silicon substrate and the LOCOS oxide film to a predetermined thickness using the resultant structure as a mask so that a trench is formed in the field region;
   forming a CVD oxide film on the resultant structure so that the trench is sufficiently filled;
   forming an STI structure of oxide film material including the lateral extension in the field region by processing the CVD oxide film by a CMP process so that the nitride film remains in a predetermined thickness on the pad oxide film;

removing the remaining nitride film and the pad oxide film so that the first and second active regions are exposed;

performing a CMOS-well ion-implantation process and a channel ion implantation process;

forming a first thermal oxide film for a gate oxide film in the first active region and the second active region;

removing the first thermal oxide film in the first active region; and forming in the first active region a second thermal oxide film for a gate oxide film thinner than the first thermal oxide film.

10. The method as claimed in claim 9, wherein the lateral extension comprises an angular extension.

11. The method as claimed in claim 10, wherein the angular extension comprises a bird's beak-shaped structure.

12. The method as claimed in claim 9, wherein the first active region is an LV region and the second active region is an HV region.

* * * * *